United States Patent [19]

Hefner, Jr. et al.

[11] 4,410,686

[45] Oct. 18, 1983

[54] NORBORNYL MODIFIED POLYESTERAMIDES AND PROCESS FOR PREPARING SAME

[75] Inventors: Robert E. Hefner, Jr.; James C. Uroda, both of Lake Jackson, Tex.

[73] Assignee: The Dow Chemical Company, Midland, Mich.

[21] Appl. No.: 333,221

[22] Filed: Dec. 21, 1981

[51] Int. Cl.³ .................. C08G 63/44; C08G 69/44
[52] U.S. Cl. ................... 528/288; 528/183; 528/298; 528/303; 549/237; 560/117
[58] Field of Search ............ 528/183, 288, 298, 303; 560/117; 549/237

[56] References Cited

U.S. PATENT DOCUMENTS

| 3,340,327 | 9/1967 | Spellberg et al. | 528/288 |
| 3,933,757 | 1/1976 | Pratt et al. | 528/303 |
| 3,956,228 | 5/1976 | Nogami et al. | 528/298 |
| 4,246,367 | 1/1981 | Curtis | 528/298 |
| 4,248,997 | 2/1981 | Ihida | 528/298 |
| 4,299,950 | 11/1981 | Iwata et al. | 528/288 |
| 4,348,499 | 9/1982 | Nelson | 528/303 |

Primary Examiner—Lucille M. Phynes

[57] ABSTRACT

Polyesteramides modified by having at least one terminal norbornene radical have improved physical and chemical properties, such as enhanced corrosion resistance, electrical properties, and heat stability. The modified polyesteramides are prepared by a process of reacting a dicarboxylic acid, a diamine, a polyol and a norbornene compound.

70 Claims, No Drawings

NORBORNYL MODIFIED POLYESTERAMIDES AND PROCESS FOR PREPARING SAME

BACKGROUND OF THE INVENTION

Unsaturated polyesters and polyamides are two classes of materials useful in the fabrication of a wide variety of products. By varying the starting monomers, some can be made spinnable into fibers and filaments; some are useful in casting; some are moldable; still others can be formulated into coatings. The physical and chemical properties can be changed through choice of monomers, polymerization procedures and other means. None are without one or more deficiencies, however.

More recently, a class of polyesteramides has been developed. Basically, those materials have been the random interpolymerization of a dicarboxylic acid with a diol and a diamine. The products have exhibited a spectrum of properties substantially different from either polyesters or polyamides.

Also recently, polyesters have been modified with dicyclopentadiene to result in products having reduced shrinkage upon curing, enhanced hydrophobicity and better economics than the corresponding unmodified polyesters.

Although all of those materials have been useful in making products acceptable in the marketplace, there is room for considerable improvement in many of their properties.

SUMMARY OF THE INVENTION

This invention provides a new class of modified polyesteramides having an improved spectrum of properties. The polyesteramides have at least one terminal group that is a norbornene radical.

DETAILED DESCRIPTION OF THE INVENTION

The new polyesteramides have a central esteramide chain and have at least one terminal norbornene radical. The central ester amide chain is composed of the polymerizate of a diamine, a polyol and an unsaturated polycarboxylic acid.

The diamine is from the class of those having the formula:

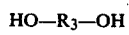

wherein $R_1$ and $R_2$ are independently selected from the group consisting of hydrogen, aliphatic, cycloaliphatic and aromatic radicals or $R_1$ and $R_2$ taken together with the remainder of the molecule form an aliphatic ring; and $R_3$ is a divalent organic radical selected from the group consisting of alkylene, ether-linked alkylene, ether-linked arylene, alkylene amino-linked alkylene, alkylene amino-linked cycloalkylene, cycloalkylene, polycycloalkylene, arylene, alkylarylene, bis(alkyl)cycloalkylene and bis(alkyl) polycycloalkylene.

Typical diamines that are useful herein are ethylene diamine, propylene diamine, hexane-1,6-diamine, piperazine, 4,4'-methylenebis(cyclohexylamine), 2,2'-bis(4-aminocyclohexyl)propane, 4,4'-diaminodiphenyl ether, bis(aminomethyl)norbornene, toluene diamine, bis(aminomethyl) dicyclopentadiene and homopiperazine.

Typical polyamines are aminoethylpiperiazine and diethylenetriamine.

The polyol is from the class of those having the formula:

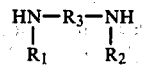

wherein $R_3$ is a divalent organic radical selected from the group consisting of alkylene, ether-linked alkylene, ether-linked arylene, cycloalkylene, polycycloalkylene, bis(alkyl)cycloalkylene, bis(alkyl)polycycloalkylene, and arylene. Mixtures of two or more of such polyols can be used.

Representative of the useful polyols are the diols such as ethylene glycol, propylene glycol, diethylene glycol, dipropylene glycol, dicyclopentadiene dimethanol, bis(hydroxymethyl)norbornane, methyl cyclohexanedimethanol, bis(hydroxypropyl)bisphenol A and other hydroxyalkylated bisphenols, pentaerythritol, sorbitol and glycerine.

The ratio of diamine to polyol can be varied within wide limits. That ratio is significantly related to the solubility of the modified polyesteramide in reactive diluents, such as styrene, which are commonly employed with polyesteramides for many applications. As a general rule, the amount of diamine should not exceed about ⅓ the combined weight of the polyol and diamine. The structure and size of the diamine molecule will determine to great extent the maximum amount of diamine that can be used.

The $\alpha,\beta$-unsaturated polycarboxylic acid is preferably maleic acid, fumaric acid, maleic anhydride or mixtures of those compounds. Such acids are readily available, have good reactivity with the polyol and diamine, and result in products of good properties.

Part of the $\alpha,\beta$-unsaturated acid may be replaced with a saturated or aromatic polycarboxylic acid to vary the cross-linking potential and physical properties of the modified polyesteramide. Such acids include the aliphatic acids such as adipic acid and the aromatic acids such as isophthalic acid. Replacement of part of the $\alpha,\beta$-unsaturated acid with such acids is commonplace in the polyester art. Suitable selection of acid and amount to achieve a desired purpose will be known to the skilled worker and can be optimized with simple preliminary experiments.

The total amount of acid varies as a function of the total polyol, diamine and norbornene ingredients used.

The terminal group used to modify the polyesteramide is a norbornene radical. Dicyclopentadiene is a most preferred norbornene functional material to be employed in terminating one or both ends of the chain. Polycyclopentadiene (i.e., DCPD oligomers) or dicyclopentadiene monoalcohol are also preferred species. Norbornene itself can also be used.

DCPD is sold commercially as a product of about 97 or greater percent purity. It is also sold as a $C_{10}$ hydrocarbon concentrate prepared by dimerizing a crude $C_5$ stream from the cracking of hydrocarbons as taught in U.S. Pat. No. 3,557,239. A preferred DCPD source is one that is low in peroxides and hydroperoxides and in light hydrocarbons and residual cyclopentadiene.

These concentrates have as the main reactive components about 70 to about 90 percent by weight of dicyclopentadiene, about 5 to about 30 percent by weight of the mixed Diels-Alder dimers of diolefins such as butadiene, cis- and trans-piperylene, isoprene, cyclopentadiene and methyl cyclopentadiene. The remainder of these concentrates generally comprise residual C$_5$ hydrocarbons and oligomers of the above diolefins.

Examples of some of the dimers which have been identified in these concentrates are the Diels-Alder adducts of two moles of isoprene (isoprene dimers), the adduct of cyclopentadiene and isoprene, the adduct of cyclopentadiene and piperylene, and the like.

Either the C$_{10}$ concentrate or the relatively pure DCPD may be employed in preparing the modified polyester amides.

The modified polyesteramides can be prepared by a variety of techniques. In a preferred method, hereinafter called the "hydrolysis method," molten $\alpha,\beta$-unsaturated carboxylic anhydride is partially hydrolyzed with less than the stoichiometric equivalent of water and reacted with the norbornene derivative to form a half ester of that derivative and containing unesterified acid and anhydride. This reaction may conveniently be performed in stages whereby reactants are added stepwise, thus controlling exotherms. That product mixture is then reacted with the polyol and diamine to result in the desired modified polyesteramide.

In a typical procedure, molten maleic anhydride and a fraction of the stoichiometric equivalent of water is maintained at an elevated temperature of from about 60° to 130° C. The initial fractional equivalents of dicyclopentadiene (DCPD) is then added and allowed to react. A second fractional equivalent of water and of DCPD is added and allowed to react. Additional fractional equivalents of DCPD are added and each allowed to react before subsequent addition of the next increment until the desired amount of DCPD has been added.

The amount of maleic (or other) anhydride employed in this first esterification step may be equal to the equivalent of DCPD in which event the product is essentially all monoester. Alternatively, the amount of anhydride may be the equivalent needed to make the monoester plus that excess that is to be used in the subsequent esteramidation step.

To the mixture of DCPD monoester and acid and/or anhydride is added the polyol and diamine. That addition can be a bulk addition wherein all of the polyol and diamine are added in one step. The addition can be an incremental addition wherein all of the polyol and a fractional equivalent of the diamine are added initially and allowed to react after which subsequent increments of diamine are added. In all instances, water is continuously removed during the esteramidation step. The timing of the remaining diamine additions can be easily determined by the amount of water removed by acid number or by viscosity. A convenient and practical guide is to add a diamine increment when about one fourth to one half of the expected water from the prior addition has been collected. Incremental diamine addition aids in the control of reaction exotherm when some diamines are used.

After addition of the polyol and diamine is complete, the reaction can be driven to maximum yield by maintaining or increasing the temperature until the desired acid number has been reached. Typically, acid numbers of 25 to 35 are preferred, although acid numbers that are somewhat higher or lower may be tolerated, and, in some instances, may be desired for certain applications.

In an equally preferred method, hereinafter called the "prehydrolysis method," molten, $\alpha,\beta$-unsaturated carboxylic anhydride is essentially totally hydrolyzed with a stoichiometric or greater equivalent of water and reacted with the norbornene derivative to form a half ester of that derivative and containing unesterified acid. This reaction may conveniently be performed in stages whereby reactants are added stepwise thus controlling reaction exotherms. That product mixture is then reacted with the polyol and diamine to result in the desired modified polyesteramide.

In a typical procedure, molten maleic anhydride and the stoichiometric or greater equivalent of water are maintained at an elevated temperature of from about 120° to 150° C. The temperature is allowed to stabilize at about 120° to 125° C. and the initial fractional equivalent of DCPD is then added and allowed to react. A second fractional equivalent of DCPD is added and allowed to react. Additional fractional equivalents of DCPD are added and each allowed to react before subsequent addition of the next increment until the desired amount of DCPD has been added.

The amount of maleic (or other) anhydride employed in this first esterification step may be equal to the equivalent of DCPD in which event the product is essentially all monoester. Alternatively, the amount of anhydride may be the equivalent needed to make the monoester plus that excess that is to be used in the subsequent esteramidation step.

The polyol and diamine are added to the mixture of DCPD monoester and acid as described in the aforementioned hydrolysis method.

In a further modification of either the hydrolysis or prehydrolysis method, a polyol containing 3 or more hydroxyl groups such as pentaerythritol may be separately added to the reaction after polyesteramidation is substantially complete. This serves to rapidly increase molecular weight and viscosity by cross-linking of the esteramide chains. Modified physical properties result from this embodiment.

Many other alternate methods will be recognized by the skilled worker. For example, molten maleic anhydride may be added to a mixture of DCPD and water maintained in a reactor. The polyol and diamine are added to the mixture of DCPD monoester and acid and/or anhydride as before. Finally, although less preferred, DCPD, maleic anhydride, water, glycol, and none, all or part of diamine may be simultaneously reacted.

An alternative method, hereinafter called the "half ester method," for preparing the modified polyesteramides, involves preparing the central esteramide chain and subsequently capping at least one end of that chain with the norbornene derivative. Water is not used in this method. In a typical procedure, an $\alpha,\beta$-unsaturated dicarboxylic anhydride, a glycol and a diamine are reacted at an elevated temperature of about 130° to 150° C. with removal of water. After substantial completion of that reaction, a fraction of the norbornene derivative, such as DCPD, is added and reacted at elevated temperature. That is followed by additional increments of DCPD with each succeeding increment added after substantial completion of the reaction of the preceding increment. After all DCPD additions are complete, reaction is continued at 200° C. with continual removal of water until the desired acid number is reached.

As is common in the unsaturated polyester and polyesteramide art, the modified polyesteramides of this invention may be blended with a monomer that is compatible therewith. Typical of the vinyl monomers are the alkenyl aromatics, such as styrene or vinyltoluene. Acrylic monomers, although less preferred, may also be used separately or in conjunction with the vinyl monomer. Typical of the acrylic monomers is dicyclopentadiene acrylate. Other useful vinyl monomers will be known to the skilled worker. The vinyl monomer, frequently called a reactive diluent, may be employed within a wide range of concentration of from about 20 to 80 percent of diluent to 80 to 20 percent of the resin. The optimum amount will depend in large measure on the polyesteramide, the diluent and the properties desired in the uncured and the cured states. Reactive diluents are employed principally to adjust the viscosity of a resin blend to permit its facile use in a given fabrication procedure. A coating formulation will usually require a lower viscosity than a molding formulation.

Other additives that are conventional in the polyester and polyesteramide art may also be included in formulations based upon these modified polyesteramides. Thus, fillers, pigments and other colorants, reinforcing fibers, and other additives may be added to serve their intended function.

The polyesteramides are curable by known catalyst systems. Peroxides, such as methyl ethyl ketone peroxides, can be used with or without known promoters, such as cobalt octoate or cobalt naphthenate, that function with such peroxides. Acyl peroxides, such as benzoyl peroxides can be used with or without promoters such as tertiary amines, including typically dimethyl aniline and N,N-dimethyl-p-toluidine. The concentrations of catalyst and promoter are adjusted within known limits of from about 0.1 to 3.0 weight percent depending on the rate of cure desired, the magnitude of the generated exotherm and for other known purposes. Known gelation retarding agents, such as p-benzoquinone, can be employed in the curing system.

The modified polyesteramides have properties that make them well adapted for coating, casting, lamination, molding, filament winding and other known fabrication procedures. A preferred use is in glass fiber laminates. The compositions prepared from the polyesteramides form articles that are especially useful in corrosive environments, high temperature environments or in some electrical insulating applications, such as encapsulation of electrical components.

The compositions and process of the invention are illustrated in the following examples wherein all parts and percentages are by weight.

EXAMPLES 1-13

Modified polyesteramides were prepared from various diols and diamines. In each instance the amount of maleic anhydride was 2.0 moles; dicyclopentadiene concentrate was 1.2 moles; and 1.4 moles water. The DCPD concentrate contained 83.94 percent DCPD; 14.41 percent codimers; 1.11 percent lights and 0.55 percent cyclopentadiene. Example 8 used 98 percent DCPD instead of the concentrate. The composition of the diol and diamine is shown in Table I.

The procedure was the hydrolysis method involving three steps, viz: (a) a hydrolysis step consisting of the reaction of a norbornene functional reactant plus maleic anhydride (MA), and water, (b) a diol/diamine addition step, (c) a polyesteramidation step. Specifically, the reaction was performed as follows:

Hydrolysis Step

Maleic anhydride (MA) was charged to a reactor and melted to a clear solution at 70° C. A nitrogen atmosphere was continually maintained in the reactor. To this, 1.05 m of water is added followed by 0.3 m of DCPD after two minutes. Twenty minutes later, 0.3 m DCPD and 0.35 m of water are added to the reactor. After 15 more minutes, 0.3 m DCPD is charged to the reactor. The final 0.3 m DCPD is added 15 minutes later and the reactor is heated to 110° C. and held for 30 minutes of reaction.

Diol/Diamine Addition Step

Two different modes of addition of the diol/diamine components were used. In the bulk diamine addition method, the total required diol/diamine stoichiometry was added to the reactor followed by heating to 160° C. and removal of water via a steam condenser—Dean Stark trap—cold water condenser assembly, and increased nitrogen sparging. A total reaction time of 2 hours is used at the 160° C. temperature.

In the *incremental diamine addition method*, the total diol stoichiometry plus some fraction of the diamine stoichiometry were added to the reactor, followed by incremental additions of the remaining diamine requirement as a function of continuing reaction (conversion). As a specific example, in Example 2, 1.17 m of propylene glycol (PG) containing 0.13 m of 4,4'-methylenebis(cyclohexylamine) was initially added to the reaction. After approximately ¼ of the expected water of the reaction was removed, a second increment of diamine (0.13 m) was added. This was followed by a third and final incremental addition of diamine (0.13 m) after approximately ½ of the expected water of the reaction was removed.

Polyesteramidation Step

The reaction temperature was increased to 205° C. and water was continually removed until the desired final acid number was attained. Acid numbers of 25 to 35 are preferred. The reaction was cooled to 160° C. and 100 ppm of hydroquinone was added as an inhibitor.

Comparative Examples C-1 and C-2

DCPD modified unsaturated polyesters were prepared using the above method except that only the glycol reactant (no diamine) was used. Example C-1 employed 1.56 moles propylene glycol. Example C-2 employed 1.56 moles DCPD dimethanol.

In Table I the following abbreviations are used:
PG—Propylene Glycol
PG/DPG—Propylene Glycol/Dipropylene Glycol
DCPD-DM—DCPD-dimethanol
Bis A/2PO—bis(hydroxypropyl) bisphenol A
Diamine A—4,4'-methylenebis(cyclohexylamine)
Diamine B—2,2'-bis(4-aminocyclohexyl)propane
Diamine C—1,6-diamino hexane
Diamine D—Diaminodiphenyl ether
Diamine E—bis(aminomethyl)dicyclopentadiene
Diamine F—bis(2-aminoethyl)ether
Diamine G—Diethylenetriamine Examples 1, 3, 5, 6 and 9 were prepared with bulk amine addition. Examples 2, 4, 7, 8, 10-13 were prepared with incremental amine addition.

TABLE I

| Example | PG | PG/DPG | DCPD-DM | Bis A/2PO |
|---|---|---|---|---|
| 1 | 1.17 | — | — | — |
| 2 | 1.17 | — | — | — |
| 3 | — | — | 1.248 | — |
| 4 | — | — | 1.248 | — |
| 5 | — | — | 1.248 | — |
| 6 | — | — | 1.248 | — |
| 7 | 1.248 | — | — | — |
| 8 | 1.248 | — | — | — |
| 9 | — | 0.624/0.624 | — | — |
| 10 | — | — | — | 1.248 |
| 11 | — | — | 1.04 | — |

TABLE I-continued

| Example | Diamine | | | | | | |
|---|---|---|---|---|---|---|---|
| | A | B | C | D | E | F | G |
| 12 | 1.404 | — | — | — | | | |
| 13 | 1.248 | — | — | — | | | |
| 1 | 0.39 | — | — | — | — | — | — |
| 2 | 0.39 | — | — | — | — | — | — |
| 3 | — | — | 0.312 | — | — | — | — |
| 4 | — | — | 0.312 | — | — | — | — |
| 5 | — | 0.312 | — | — | — | — | — |
| 6 | — | — | 0.312 | — | — | — | — |
| 7 | — | — | — | — | 0.312 | — | — |
| 8 | — | — | — | — | 0.312 | — | — |
| 9 | — | — | — | 0.312 | — | — | — |
| 10 | — | — | — | — | 0.312 | — | — |
| 11 | — | — | — | — | 0.520 | — | — |
| 12 | — | — | — | — | — | — | 0.156 |
| 13 | — | — | — | — | — | 0.312 | — |

The resulting polyesteramide alkyds were formulated to obtain a 43 percent styrene—57 percent alkyd solution. These solutions were used to determine SPI gel characteristics, Brookfield viscosity (25° C.), and various clear, unfilled castings were made for heat distortion temperature, tensile and flexural strength and percent elongation and corrosion resistance testing.

The heat distortion bars were cured at room temperature using 0.1 percent cobalt naphthenate (6 percent), 1 percent methyl ethyl ketone peroxide, and 0.02 percent dimethylaniline. The room temperature cured bars were postcured for 2.0 hours at 93° C. (200° F.). Circular, clear, unfilled castings of 3.5 cm diameter and 0.5 cm thick were cured and postcured using the method described for the heat distortion bars and used in corrosion tests. Corrosion tests were performed in DI water, toluene, 5 percent sodium hydroxide, and 25 percent sulfuric acid for 7 days at 25° C. Clear, unfilled castings for use in tensile and flexural strength evaluations were made using a cure system of 1 percent benzoyl peroxide and 0.01 percent dimethylaniline at room temperature followed by postcuring for 2 hours at 93° C. (200° F.).

The results are shown in the following Table II. Corrosion test results are shown in Table III. All changes are reported as percentages of original.

In all of the tables in the application, the heat distortion temperatures were measured in degrees F. and are reported in degrees C. derived from the standard conversion table. The values for tensile strength and flexural strength were determined in pounds per square inch (reported parenthetically as kilograms per square centimeter calculated by multiplying the psi by 0.0703). Viscosity was determined in centipoises and converted to Pascal seconds by multiplying the former by 0.001.

TABLE II

| Example | Acid Number | Viscosity | HDT (°C.) | SPI Gel - 84° C. | | |
|---|---|---|---|---|---|---|
| | | | | Gel Time (min) | Cure Time (min) | Max. Exotherm (°C.) |
| 1 | 33.7 | .262 | 109.5 | 1.7 | 2.9 | 160 |
| 2 | 34.6 | .143 | 111.1 | 3.3 | 5.0 | 167 |
| 3 | 33.7 | .142 | 88.3 | 4.2 | 7.1 | 140 |
| 4 | 32.4 | .089 | 87.2 | 2.5 | 4.7 | 172 |
| 5 | 28.1 | .235 | 106.1 | 2.4 | 4.6 | 195 |
| 6 | 28.1 | .127 | 99.8 | 0.8 | 2.2 | 99 |
| 7 | 32.5 | .053 | 106.1 | 1.3 | 2.9 | 169 |
| 8 | 31.7 | .090 | 106.1 | 1.4 | 3.1 | 178 |
| 9 | 29.4 | .100 | 97.8 | 1.3 | 3.7 | 125 |
| 10 | 31.8 | .086 | 66.7 | 3.8 | 8.5 | 103 |
| 11 | 35.7 | .938 | 71.7 | 3.0 | 8.6 | 111 |
| 12 | 39.6 | .250 | 101.1 | 1.9 | 4.1 | 147 |
| 13 | 29.4 | .070 | 90.0 | 1.9 | 3.7 | 171 |
| C-1 | 33.2 | .045 | 99 | 5.6 | 7.1 | 156 |
| C-2 | 32.0 | .091 | 86 | 5.3 | 9.6 | 165 |

| Example | Ave. Barcol Hardness | Tensile Strength × 10³ psi (Kg/cm²) | Elongation (%) | Flexural Strength × 10³ psi (Kg/cm²) |
|---|---|---|---|---|
| 1 | 44.0 | 4.095 (287.88) | 0.96 | 8.705 (0.616) |
| 2 | 45.0 | 3.329 (234.03) | 0.82 | 6.792 (0.4775) |
| 3 | 46.0 | 6.614 (464.96) | 1.42 | 10.985 (0.7722) |
| 4 | 44.9 | 5.766 (405.35) | 1.36 | 11.329 (0.7964) |
| 5 | 48.4 | 3.799 (277.69) | 0.87 | 9.532 (0.5929) |
| 6 | 20.3 | 3.950 (277.69) | 1.54 | 8.434 (0.5929) |
| 7 | 45.0 | 5.337 (375.19) | 1.20 | 10.749 (0.7557) |
| 8 | 44.4 | 4.902 (344.61) | 1.10 | 9.993 (0.7025) |
| 9 | 38.6 | 5.739 (403.45) | 1.77 | 12.139 (0.8534) |
| 10 | 42.7 | 6.575 (462.22) | 1.46 | 12.360 (0.8689) |
| 11 | 40.6 | 5.822 (409.29) | 1.17 | 10.994 (0.7729) |
| 12 | 46.8 | 4.730 (332.52) | 1.13 | 12.535 (0.8812) |
| 13 | 46.8 | 5.439 (382.36) | 1.12 | 10.381 (0.7298) |
| C-1 | 48.3 | 3.117 (332.52) | 0.71 | 10.176 (0.7154) |
| C-2 | 47.3 | 6.630 (466.09) | 1.41 | 17.748 (1.2477) |

TABLE III

| Example | DI. Water | | Toluene | | 5% NaOH | | 25% Sulfuric Acid | |
|---|---|---|---|---|---|---|---|---|
| | Change Barcol | Change Weight | Change Barcol | Change Weight | Change Barcol | Change Weight | Change Barcol | Change Weight |
| 1 | +0.73 | +0.23 | +0.73 | −0.04 | 0 | −1.93 | 0 | +0.15 |
| 2 | +5.13 | +2.21 | +6.54 | −0.37 | +2.29 | −1.81 | +0.75 | −1.32 |
| 3 | +0.73 | +0.09 | −16.44 | +0.57 | +0.75 | −1.23 | +0.74 | −1.75 |
| 4 | +9.17 | +0.09 | −17.32 | +0.50 | +0.74 | −2.37 | +2.22 | −1.26 |
| 5 | +2.90 | +0.54 | −11.04 | +0.42 | +0.75 | +0.11 | +1.46 | +0.09 |
| 6 | +1.50 | +0.09 | −3.22 | −5.42 | +13.33 | −3.92 | +5.45 | −1.04 |
| 7 | 0 | +0.40 | −6.16 | 0 | 0 | −1.84 | +4.69 | −0.95 |
| 8 | +1.01 | +0.40 | −1.40 | +0.11 | +1.50 | −2.29 | +2.27 | −2.44 |
| 9 | +5.5 | +0.12 | +2.42 | −1.12 | +1.52 | −2.75 | +3.20 | −0.67 |
| 10 | −1.87 | +0.40 | — | —(1) | 0 | −1.61 | −0.85 | −2.44 |
| 11 | +3.13 | −0.05 | −2.44 | −1.85 | +1.75 | −0.10 | 0 | 0 |
| 12 | +2.10 | +0.14 | −11.89 | −0.06 | — | — | — | — |
| 13 | 0 | +0.55 | +3.08 | +0.03 | 0 | 0 | +0.87 | +0.30 |
| C-1 | −4.32 | −0.23 | −2.17 | +0.02 | −5.44 | −1.59 | −2.70 | −1.41 |

TABLE III-continued

| Example | DI. Water Change Barcol | DI. Water Change Weight | Toluene Change Barcol | Toluene Change Weight | 5% NaOH Change Barcol | 5% NaOH Change Weight | 25% Sulfuric Acid Change Barcol | 25% Sulfuric Acid Change Weight |
|---|---|---|---|---|---|---|---|---|
| C-2 | +3.12 | +0.03 | — | — | +1.52 | −1.07 | +0.74 | −0.31 |

[1] Sample fractured on 3rd day of test.

EXAMPLES 14–20

Modified polyesteramides were prepared by the hydrolysis method of Examples 1–13, except that a DCPD concentrate containing 82.60 percent DCPD, 16.84 percent codimers, 0.52 percent lights and 0.04 percent trimers was used in place of the DCPD concentrate of those examples. The compositions of the diol and diamine are shown in Table IV. The resulting polyesteramide alkyds were formulated and tested using the methods of Examples 1–13. The results are shown in the following Table V.

Corrosion resistance testing of the polyesteramides is shown in Table VI. All changes are in percent of original. Corrosion resistance testing of these polyesteramides was accelerated at 50° C. for a total of 148 hours, unless damage necessitated earlier removal. All of the polyesteramides were tested as clear, unfilled castings of 1.5×1.0×0.165 inch dimensions. A cure system of 1 percent benzoyl peroxide and 0.01 percent dimethylanilide was used at room temperature followed by postcuring for 2.0 hours at 93° C. (200° F.). Twenty-four hours of sample recovery in open room temperature air was allowed prior to measurement of weight and Barcol hardness of the exposed test samples. Corrosion resistance testing of the commercially available general purpose polyester, Corezyn (Interplastics) was evaluated as a comparative standard.

Comparative Example 3

The DCPD modified unsaturated polyester of Comparative Example 3 was prepared using the method of Comparative Example C-1.

TABLE IV

| Example | PG | Amino-methyl-piperazine | Ethylene diamine | bis-(aminomethyl)-DCPD | Piperazine |
|---|---|---|---|---|---|
| 14 | 1.404 | 0.156 | — | — | — |
| 15 | 1.404 | — | 0.156 | — | — |
| 16 | 1.404 | — | 0.156 | — | — |
| 17 | 1.248 | — | 0.312 | — | — |
| 18 | 1.248 | — | 0.312 | — | — |
| 19 | 1.248 | — | — | 0.312 | — |
| 20 | 1.404 | — | — | — | 0.156 |
| For Comparison | | | | | |
| C-3 | 1.56 | — | — | — | — |

All examples, except 18, were prepared with bulk diamine addition. Example 18 was prepared with incremental diamine addition.

TABLE V

| Example | Acid Number | Viscosity | HDT (°C.) | SPI Gel - 84° C. Gel Time (min) | SPI Gel - 84° C. Cure Time (min) | SPI Gel - 84° C. Max. Exotherm (°C.) |
|---|---|---|---|---|---|---|
| 14 | 33.2 | 1.780 | 110.0 | 0.7 | 2.1 | 202 |
| 15 | 31.4 | .110 | 111.1 | 1.9 | 3.5 | 230 |
| 16 | 22.4 | 2.600 | 117.2 | 1.3 | 2.4 | 203 |
| 17 | 34.4 | .286 | 111.1 | 1.5 | 3.2 | 175 |
| 18 | 35.1 | .762 | 106.1 | 1.4 | 3.5 | 198 |
| 19 | 33.7 | .407 | 115.6 | 1.0 | 2.1 | 213 |
| 20 | 40.3 | .284 | 111.7 | 2.3 | 3.6 | 220 |
| C-3 | 34.7 | .061 | 110.6 | 3.4 | 4.8 | 195 |

TABLE V-continued

| Example | Ave. Barcol Hardness | Tensile Strength × 10³ psi (Kg/cm²) | Elongation (%) | Flexural Strength × 10³ psi (Kg/cm²) |
|---|---|---|---|---|
| 14 | 48.2 | 4.054 (284.99) | 0.95 | 11.925 (0.8383) |
| 15 | 50.1 | 4.069 (286.05) | 0.88 | 13.118 (0.9222) |
| 16 | 50.6 | 3.858 (271.22) | 0.86 | 9.855 (0.6928) |
| 17 | 47.5 | 3.333 (234.31) | 0.91 | 11.584 (0.8144) |
| 18 | 49.0 | 3.742 (263.06) | 0.85 | 10.945 (0.7694) |
| 19 | 50.4 | 3.446 (242.25) | 0.76 | 11.356 (0.7983) |
| 20 | 46.4 | 2.272 (159.72) | 0.54 | 11.341 (0.7973) |
| C-3 | 51.5 | 3.440 (241.83) | 0.79 | 9.951 (0.6996) |

TABLE VI

| Example | DI. Water Change Barcol | DI. Water Change Weight | 5% NaOH Change Barcol | 5% NaOH Change Weight |
|---|---|---|---|---|
| 14 | +17.11 | +0.48 | +2.41 | +0.05 |
| 15 | +6.62 | +0.48 | +3.21 | +0.35 |
| 16 | +6.02 | +0.49 | +4.73 | +0.45 |
| 17 | +4.19 | +0.56 | −1.76 | +0.24 |
| 18 | −2.33 | +0.60 | −10.15 | +0.20 |
| 19 | +3.89 | +0.50 | −3.68 | +0.39 |
| 20 | −2.03 | +0.53 | −9.13 | +0.17 |
| C-3 | +7.50 | +0.43 | −1.93 | +0.09 |
| Corezyn | +0.83 | +0.64 | −7.44 | −0.26 |

| Example | 25% Sulfuric Acid Change Barcol | 25% Sulfuric Acid Change Weight | Toluene Change Barcol | Toluene Change Weight | Time to Initial Fracture (hr) |
|---|---|---|---|---|---|
| 14 | +11.89 | +0.05 | −84.1[1] | +8.23[1] | 45.3 |
| 15 | +10.26 | +0.35 | not measured | | 52.8 |
| 16 | +8.82 | +0.36 | −51.0 | +4.99 | 148 |
| 17 | +6.83 | +0.37 | not measured | | 28.8 |
| 18 | +0.21 | +0.40 | not measured | | 76.8 |
| 19 | +2.25 | +0.36 | not measured | | 69.3 |
| 20 | +2.03 | +0.33 | −57.2 | +5.00 | None |
| C-3 | +5.57 | +0.31 | Not measured | | 21.3 |
| Corezyn | −0.21 | +0.51 | −100.0[1] | +7.54[1] | 28.8 |

[1] Measured at end of 148-hour test even though initial fracture occured earlier.

EXAMPLES 21–23

Modified polyesteramides were made by the hydrolysis method of the preceding examples using the same amount of maleic anhydride, DCPD and water. Propylene glycol and 4,4'-methylenebis(cyclohexylamine) were used in varying amounts as follows: (moles)

| Example | Propylene Glycol | 4,4'-methylenebis-(cyclohexylamine) | Acid No. |
|---|---|---|---|
| 21 | 1.17 | 0.390 | 32.7 |
| 22 | 1.092 | 0.468 | 34.8 |
| 23 | 0.78 | 0.78 | 40.1 |

Examples 22 and 23 were insoluble in 43 percent styrene. Example 21 had a viscosity of 0.262 Pascal seconds, a HDT of 229° F. and SPI gel at 84° C. of 1.7 minutes to gel, 2.9 minutes to cure and a maximum exotherm of 160° C.

EXAMPLE 24

A modified polyesteramide was made by the hydrolysis method of the preceding examples using the same amount of maleic anhydride and water. Polycyclopentadiene (1.2 moles) containing 52.2 percent DCPD and tricyclopentadiene, 40.4 percent tetra- and pentacyclopentadiene and 7.4 percent hexacyclopentadiene and highers was used in place of the DCPD concentrate of the preceding examples. The diol was PG (1.248 moles) and the bis(aminomethyl) DCPD (0.312 mole) diamine was incrementally added. The resulting polyesteramide alkyd was formulated and tested for mechanical properties and corrosion resistance using the method of Examples 1-13. The following results were obtained.

| | |
|---|---|
| Acid number | 34.5 |
| Viscosity | .105 |
| HDT (°C.) | 103.3 |
| SPI Gel-84° C. | |
| gel time (min.) | 1.5 |
| cure time (min.) | 3.7 |
| max. exotherm (°C.) | 172 |
| Ave. Barcol Hardness | 44.4 |
| Tensile strength × $10^3$ psi | 3.032 |
| (Kg/cm$^2$) | (213.15) |
| Elongation (%) | 0.58 |
| Flexural Strength × $10^3$ psi | 6.549 |
| (Kg/cm$^2$) | (0.4604) |
| Corrosion Resistance | |
| DI. Water | |
| Change Barcol | 0 |
| Change Weight | +0.09 |
| 5% NaOH | |
| Change Barcol | +10.74 |
| Change Weight | −2.66 |
| 25% Sulfuric Acid | |
| Change Barcol | +4.76 |
| Change Weight | −1.62 |
| Toluene | |
| Change Barcol | 0 |
| Change Weight | −0.23 |

EXAMPLE 25

A modified polyesteramide was made by the hydrolysis mwethod of the preceding examples, except that the reaction temperature during polyesteramidation never exceeded 165° C. The same amount of maleic anhydride and water were used and norbornene (1.2 moles) was used in place of the DCPD concentrate of the preceding examples. The diol was PG (1.248 moles) and the bis(aminomethyl) DCPD (0.312 mole) diamine was incrementally added. The resulting polyesteramide alkyd was formulated and tested for mechanical properties and corrosion resistance using the method of Examples 1-13.
The following results were obtained:

| | |
|---|---|
| Acid number | 55.1 |
| Viscosity | .156 |
| HDT (°C.) | 116.1 |
| SPI Gel-84° C. | |
| gel time (min.) | 1.7 |
| cure time (min.) | 2.5 |
| max. exotherm (°C.) | 160 |
| Ave. Barcol Hardness | 47.6 |
| Tensile strength × $10^3$ psi | 4.679 |
| (Kg/cm$^2$) | (328.93) |
| Elongation (%) | 1.10 |
| Flexural Strength × $10^3$ psi | 10.620 |
| (Kg/cm$^2$) | (0.7466) |
| Corrosion Resistance | |
| DI. Water | |
| Change Barcol | +0.83 |
| Change Weight | +0.83 |
| 5% NaOH | |
| Change Barcol | +1.55 |
| Change Weight | −2.69 |
| 25% Sulfuric Acid | |
| Change Barcol | 0 |
| Change Weight | −1.43 |
| Toluene | |
| Change Barcol | −1.63 |
| Change Weight | −0.76 |

EXAMPLE 26

A modified polyesteramide was made replacing the hydrolysis step of Examples 1-13 with a step consisting of the esterification of dicyclopentadiene monoalcohol with fumaric acid. The reaction was performed as follows:

Fumaric acid (2.0 moles), DCPD monoalcohol (1.2 moles) and SnO catalyst (0.05 percent) were charged to a reactor and heated to 185° C. under a nitrogen atmosphere. Water was continuously removed via a steam condenser—Dean Stark trap—cold water condenser assembly, and increased nitrogen sparging. A total reaction time of 2.5 hours is used at the 185° C. temperature.

The remaining diol/diamine addition and polyesteramidation steps were completed using the methods of Examples 1-13. The diol was PG (1.248 moles) and the bis(aminomethyl)DCPD (0.312 m) diamine was incrementally added. The resulting polyesteramide alkyd was formulated and tested for mechanical properties and corrosion resistance using the method of Examples 1-13. The following results were obtained:

| | |
|---|---|
| Acid number | 35.3 |
| Viscosity | .133 |
| HDT (°C.) | 110.6 |
| SPI Gel-84° C. | |
| gel time (min.) | 2.2 |
| cure time (min.) | 3.6 |
| max. exotherm (°C.) | 200 |
| Ave. Barcol Hardness | 45.6 |
| Tensile strength × $10^3$ psi | 4.162 |
| (Kg/cm$^2$) | (292.6) |
| Elongation (%) | 1.02 |
| Flexural Strength × $10^3$ psi | 10.253 |
| (Kg/cm$^2$) | (0.7208) |
| Corrosion Resistance | |
| DI. Water | |
| Change Barcol | 0 |
| Change Weight | +0.24 |
| 5% NaOH | |
| Change Barcol | −2.19 |
| Change Weight | −1.73 |
| 25% Sulfuric Acid | |
| Change Barcol | 0 |

| | |
|---|---|
| -continued | |
| Change Weight Toluene | −1.13 |
| Change Barcol | +1.36 |
| Change Weight | −0.05 |

EXAMPLE 27

A modified polyesteramide was prepared using the half ester method. Specifically, the reaction was performed as follows:

Maleic anhydride (1.0 mole), PG (0.825 mole) and 4,4′-methylenebis(cyclohexylamine) (0.275 mole) were charged to a reactor and heated to 145° C. Water was continually removed via a steam condenser—Dean Stark trap—cold water condenser assembly, and increased nitrogen sparging. After 75 minutes of reaction time, the steam condenser was shut off and a total of 0.25 mole of DCPD was added to the reactor as 0.0625 mole increments every 15 minutes for a total of 4 additions over a 45 minute period. The reactor was then held at 145° C. for 45 minutes after which time the steam condenser was restarted and the reaction temperature was increased to 200° C. Water was continually removed until the desired final acid number was attained. The reaction was cooled to 160° C. and 100 ppm of hydroquinone was added as an inhibitor. The resulting polyesteramide alkyd was formulated and tested for mechanical properties and corrosion resistance using the method of Examples 1–13. The following results were obtained:

| | |
|---|---|
| Acid number | 31.2 |
| Viscosity | .477 |
| HDT (°C.) | 104.4 |
| SPI Gel-84° C. | |
| gel time (min.) | 4.1 |
| cure time (min.) | 6.2 |
| max. exotherm (°C.) | 112 |
| Ave. Barcol Hardness | 41.3 |
| Tensile strength × 10³ psi (Kg/cm²) | 1.701 (119.6) |
| Elongation (%) | 0.32 |
| Flexural Strength × 10³ psi (Kg/cm²) | 7.141 (0.502) |
| Corrosion Resistance | |
| DI. Water | |
| Change Barcol | −10.26 |
| Change Weight | +2.75 |
| 5% NaOH | |
| Change Barcol | −8.90 |
| Change Weight | −0.05 |
| 25% Sulfuric Acid | |
| Change Barcol | +0.97 |
| Change Weight | +0.07 |
| Toluene | |
| Change Barcol | C.M.[1] |
| Change Weight | C.M.[1] |

[1]C.M.—Sample fractured on 7th day of test.

EXAMPLE 28

(a) Maleic anhydride (392.24 g) was added to a reactor and heated to 70° C. under a nitrogen atmosphere. Water (37.84 g) was added, followed by dicyclopentadiene concentrate (79.74 g) 2 minutes later. The dicyclopentadiene concentrate contained 0.52 percent lights, 16.84 percent codimers, 82.60 percent DCPD and 0.04 percent trimers. A maximum exotherm of 115° C. resulted 11 minutes later. Additional dicyclopentadiene concentrate (79.74 g) and water (12.61 g) were added to the reactor 20 minutes after the initial water addition. A third aliquot of dicyclopentadiene concentrate (79.74 g) was added 15 minutes later. Fifteen minutes later, a final aliquot of dicyclopentadiene concentrate (79.74 g) was added and the temperature controller was set at 110° C. This temperature was achieved 4 minutes later.

(b) After 30 minutes, propylene glycol (213.69 g) and piperazine (26.88 g) were added to the reactor and the steam condenser was started, nitrogen sparging was increased (4 LPM), and the temperature controller was set at 160° C. The 160° C. temperature was reached 18 minutes later. After 2 hours at 160° C., the temperature controller was set at 205° C. and this temperature was achieved 40 minutes later. After 3.42 hours, a total of 67.5 milliliters of water layer and 9.5 milliliters of organic material were collected in the Dean Stark trap. The reactor was cooled to 169° C. and 100 ppm of hydroquinone was added. The polyesteramide alkyd was recovered as a clear, light yellow solid with a final acid number of 30.5.

EXAMPLE 29

A hydrolysis step was completed in identical manner to Example 28(a). After 30 minutes, propylene glycol (189.95 g), pentaerythritol (21.24 g) and piperazine (26.88 g) were added to the reactor and the steam condenser was started, nitrogen sparging was increased, and the temperature controller was set at 160° C. The 160° C. temperature was reached 10 minutes later. After 2 hours at 160° C., the temperature controller was set at 205° C. and this temperature was achieved 23 minutes later. After 3.58 hours, a total of 68.25 milliliters of water layer and 8.5 milliliters of organic material were collected in the Dean Stark trap. The reactor was cooled to 168° C. and 100 ppm of hydroquinone was added. The polyesteramide alkyd was recovered as a clear, light yellow solid with a final acid number of 32.7.

EXAMPLE 30

A hydrolysis step was completed in identical manner to Example 28(a) except that 98 percent DCPD was used in increments of 79.33 g. After 30 minutes, propylene glycol (213.69 g) and piperazine (26.88 g) were added to the reactor and the steam condenser was started, nitrogen sparging was increased, and the temperature controller was set at 160° C. The 160° C. temperature was reached 12 minutes later. After 2 hours at 160° C., the temperature controller was set at 205° C. and this temperature was achieved 54 minutes later. After 2.3 hours, a total of 68.5 milliliters of water layer and 5.0 milliliters of organic material were collected in the Dean Stark trap. The reactor was cooled to 168° C. and 100 ppm of hydroquinone was added. The polyesteramide alkyd was recovered as a clear, light yellow solid with a final acid number of 31.2.

EXAMPLE 31

A hydrolysis step was completed in identical manner to Example 28(a). After 30 minutes, propylene glycol (213.69 g) and piperazine (26.88 g) were added to the reactor and the steam condenser was started, nitrogen sparging was increased, and the temperature controller was set at 160° C. The 160° C. temperature was reached 15 minutes later. After 2 hours at 160° C., the temperature controller was set at 205° C. and this temperature was achieved 45 minutes later. After 4.17 hours, a total of 68.5 milliliters of water layer and 8.5 milliliters of organic material were collected in the Dean Stark trap. The reactor was cooled to 168° C. and 100 ppm of hydroquinone was added. The polyesteramide alkyd was recovered as a clear, light yellow solid with a final acid number of 27.2.

EXAMPLE 32

A modified polyesteramide was prepared using the prehydrolysis method. Specifically, the reaction is performed as follows:

Maleic anhydride (392.24 g) was added to a reactor and heated to 125° C. under a nitrogen atmosphere. Water (76.59 g) was added and induced a maximum exotherm of 144° C. one minute later. Five minutes after the initial water addition, the 125° C. temperature was re-established and dicyclopentadiene concentrate (106.32 g) was added. The dicyclopentadiene concentrate contained 0.52 percent lights, 16.84 percent codimers, 82.60 percent DCPD and 0.04 percent trimers. A maximum exotherm of 130° C. resulted one minute later and was controlled by air-cooling of the reactor. The temperature controller was set at 110° C. and 15 minutes later a second aliquot of dicyclopentadiene concentrate (106.32 g) was added to the reactor. Fifteen minutes later, a final aliquot of dicyclopentadiene concentrate (106.32 g) was added. The reaction temperature was held at 110° C. for 30 minutes then propylene glycol (213.69 g) and piperazine (26.88 g) were added to the reactor and the steam condenser was started, nitrogen sparging was increased, and the temperature controller was set at 160° C. The 160° C. temperature was reached 20 minutes later. After 2 hours at 160° C., the temperature controller was set at 205° C. and this temperature was achieved 20 minutes later. After 5.0 hours, a total of 103 milliliters of water layer and 17.5 milliliters of organic material were collected in the Dean Stark trap. The reactor was cooled to 168° C. and 100 ppm of hydroquinone was added. The polyesteramide alkyd was recovered as a clear, light yellow solid with a final acid number of 32.5.

EXAMPLE 33

Maleic anhydride (137.28 g) and phthalic anhydride (88.87 g) were added to a reactor and heated to 70° C. under a nitrogen atmosphere. Water (18.92 g) was added, followed by dicyclopentadiene concentrate (39.87 g) 2 minutes later. The dicyclopentadiene concentrate contained 0.52 percent lights, 16.84 percent codimers, 82.60 percent DCPD and 0.04 percent trimers. A maximum exotherm of 106° C. resulted 14 minutes later. Additional dicyclopentadiene concentrate (39.87 g) and water (6.31 g) were added to the reactor 20 minutes after the initial water addition. A third aliquot of dicyclopentadiene concentrate (39.87 g) was added 15 minutes later. Fifteen minutes later, a final aliquot of dicyclopentadiene concentrate (39.87 g) was added and the temperature controller was set at 110° C. This temperature was achieved 8 minutes later. After 30 minutes, propylene glycol (106.84 g) and piperazine (13.44 g) were added to the reactor and the steam condenser was started, nitrogen sparging was increased, and the temperature controller was set at 160° C. The 160° C. temperature was reached 22 minutes later. After 2 hours at 160° C., the temperature controller was set at 205° C. and this temperature was achieved 19 minutes later. After 4.0 hours, a total of 31 milliliters of water layer and 7.0 milliliters of organic material were collected in the Dean Stark trap. The reactor was cooled to 168° C. and 100 ppm of hydroquinone was added. The polyesteramide alkyd was recovered as a clear, light yellow solid with a final acid number of 29.0.

EXAMPLE 34

A comparative DCPD modified unsaturated polyester standard was prepared as follows:

(a) Maleic anhydride (196.12 g) was added to a reactor and heated to a clear solution at 70° C. under a nitrogen atmosphere. Water (18.92 g) was added, followed by 98 percent dicyclopentadiene (39.67 g) 2 minutes later. A maximum exotherm of 105° C. resulted 17 minutes later. Additional water (6.31 g) and DCPD (39.67 g) were added to the reactor 20 minutes after the initial water addition. A third aliquot of DCPD (39.67 g) was added 15 minutes later. Fifteen minutes later, a final aliquot of DCPD (39.67 g) was added and the temperature controller was set at 110° C. This temperature was reached 7 minutes later.

(b) After 30 minutes, propylene glycol (59.36 g) and diethylene glycol (82.77 g) were added to the reactor and the steam condenser was started, nitrogen sparging was increased, and the temperature controller was set at 160° C. The 160° C. temperature was reached 10 minutes later. After 2 hours at 160° C., the temperature controller was set at 205° C. and this temperature was achieved 22 minutes later. After 1.8 hours, a total of 40 milliliters of water layer and 9.0 milliliters of organic material were collected in the Dean Stark trap. The reactor was cooled to 168° C. and 100 ppm of hydroquinone was added. The polyesteramide alkyd was recovered as a clear, pale yellow solid with a final acid number of 29.4.

EXAMPLE 35

A comparative DCPD modified unsaturated polyester was prepared as follows:

A hydrolysis step was completed in identical manner to Example 34(a) except that DCPD concentrate was used in increments of 39.87 g. After 30 minutes, propylene glycol (118.72 g) was added to the reactor and the steam condenser was started, nitrogen sparging was increased, and the temperature controller was set at 160° C. The 160° C. temperature was reached 16 minutes later. After 2 hours at 160° C., the temperature controller was set at 205° C. and this temperature was achieved 20 minutes later. After 2.3 hours, a total of 41.5 milliliters of water layer and 11.0 milliliters of organic material were collected in the Dean Stark trap. The reactor was cooled to 164° C. and 100 ppm of hydroquinone was added. The polyester alkyd was recovered as a clear, light yellow solid with a final acid number of 34.7.

EXAMPLE 36

The physical and mechanical properties of the polyesteramides of Examples 28–33 and the comparative polyester standard of Example 34 were determined using formulations containing 57.0 percent alkyd and 43.0 percent styrene. In addition, the physical and mechanical properties of the polyesteramides of Examples 28–31 were determined using formulations containing 67.0 percent alkyd and 33.0 percent styrene. The heat distortion bars were cured at room temperature using 0.1 percent cobalt naphthenate (6 percent), 1.0 percent methyl ethyl ketone peroxide, and 0.02 percent dimethylaniline. The room temperature cured bars were post cured for 2.0 hours at 93° C. (200° F.). Clear, unfilled castings for use in tensile and flexural strength evaluations were made using a cure system of 1.0 percent benzoyl peroxide and 0.01 dimethylaniline at room temperature, followed by post curing for 2.0 hours at 93° C. (200° F.). The data is summarized in Table VII.

TABLE VII

| | | | SPI Gel - 84° C. | | |
| | | | Gel | Cure | Maximum |
| | Styrene | Brookfield | Time | Time | Exotherm |
| Example | (%) | Viscosity | (min) | (min) | (°C.) |
|---|---|---|---|---|---|
| 28 | 33.0 | 1.008 | 3.5 | 4.4 | 160 |
|  | 43.0 | .159 | 3.2 | 4.0 | 172 |
| 29 | 33.0 | 6.800 | — | — | — |
|  | 43.0 | .208 | 1.9 | 3.3 | 231 |
| 30 | 33.0 | .654 | — | — | — |
|  | 43.0 | .097 | 2.2 | 3.7 | 229 |
| 31 | 33.0 | 4.430 | — | — | — |
|  | 43.0 | .512 | 2.1 | 3.3 | 232 |
| 32 | 43.0 | .316 | 2.1 | 3.3 | 235 |
| 33 | 43.0 | .151 | 2.7 | 4.8 | 216 |
| For Comparison | | | | | |
| 35 | 43.0 | .061 | 3.4 | 4.8 | 195 |

| | | Ave. | Tensile Strength | | Flexural Strength |
| | HDT | Barcol Hard- | × 10$^3$ psi | Elonga- tion | × 10$^3$ psi |
| Example | (C) | ness | (Kg/cm$^2$) | (%) | (Kg/cm$^2$) |
|---|---|---|---|---|---|
| 28 | 110.3 | 50.0 | 3.746 (264.84) | 0.75 | 8.261 (0.5841) |
|  | 110 | 46.9 | 3.184 (225.11) | 0.77 | 11.618 (0.8214) |
| 29 | — | 49.7 | 2.446 (172.93) | 0.51 | 7.421 (0.5247) |
|  | 109.4 | 47.2 | 3.047 (215.42) | 0.66 | 9.288 (0.6567) |
| 30 | — | 48.3 | 2.245 (158.72) | 0.52 | 11.113 (0.7857) |
|  | 113.05 | 45.4 | 4.103 (290.08) | 0.99 | 9.744 (0.6889) |
| 31 | — | 47.5 | 3.019 (213.44) | 0.61 | 13.065 (0.9237) |
|  | 108 | 43.9 | 2.812 (198.81) | 0.70 | 12.490 (0.8830) |
| 32 | 116 | 45.8 | 3.365 | 0.78 | 11.944 |

TABLE VII-continued

| 33 | 115 | 47.9 | (237.91) 5.357 (378.74) | 1.24 | (0.8444) 12.881 (0.9107) |
|---|---|---|---|---|---|
| For Comparison | | | | | |
| 35 | 110.6 | 47.7 | 3.113 (220.09) | 0.71 | 9.951 (0.7035) |

EXAMPLE 37

The corrosion resistance to 95 percent ethanol (2B) containing 2 percent toluene at 52° C. was determined for the polyesteramides of Examples 28-32, the comparative polyester standards of Examples 34 and 35, and a series of commercially available polyester standards including Corezyn, a general purpose polyester; Owens Corning Fiberglass E-720, a premium grade isophthalic polyester; Vestopal 400, a corrosion resistant polyester made from dicyclopentadiene dimethanol and fumaric acid made by Chemische Werke Huls AG; DERAKANE ®411-45 vinyl ester resin; and DERAKANE ®470-36 vinyl ester resin. The total test time was 648 hours. The percent styrene monomer utilized in each resin formulation is indicated in Table VIII. These formulations were used to prepare clear, unfilled castings from which the 1.0 inch×1.5 inch×0.165 inch thick corrosion test samples were obtained. A room temperature cure system of 1.0 percent benzoyl peroxide and 0.01 percent dimethylaniline was used, followed by post curing of the room temperature cured castings for 2.0 hours at 93° C. (200° F.).

EXAMPLE 38

The tests of Example 37 were repeated in 5 percent aqueous sodium hydroxide. All tests were run at 52° C. for a total test time of 766 hours. The results are listed in Table VIII.

EXAMPLE 39

The tests of Example 37 were repeated in toluene. All tests were run at 52° C. for a total test time of 289 hours. The results are listed in Table IX.

TABLE VIII

| | | | 5% NaOH | | Ethanol | |
| | | | | Change in Weight (%) | | Change in Weight (%) |
| | Styrene % | Initial Barcol | Change Barcol (%) | 30 min. Recovery | Change Barcol % | 30 min. Recovery |
|---|---|---|---|---|---|---|
| Example | | | | | | |
| 28 | 33.0 | 49.0 | −17.4 | +0.14 | −80.7 | +7.38 |
|  | 43.0 | 46.2 | −9.3 | +0.46 | −71.9 | +6.21 |
| 29 | 33.0 | 49.2 | −15.5 | +0.69 | −56.5 | +5.65 |
|  | 43.0 | 46.9 | −13.2 | +0.45 | −64.9 | +5.62 |
| 30 | 33.0 | 47.9 | −14.1 | −0.12 | −97.5 | +8.08 |
|  | 43.0 | 45.5 | −20.7 | +0.33 | −79.2 | +5.84 |
| 31 | 33.0 | 47.5 | −5.7 | +0.75 | −67.7 | +5.59 |
|  | 43.0 | 42.4 | −10.1 | +0.01 | −73.8 | +5.83 |
| 32 | 43.0 | 44.7 | −14.3 | +0.31 | −71.1 | +5.89 |
| For Comparison | | | | | | |
| 34 | 43.0 | 42.7 | −14.5 | +0.41 | −100.0 | +10.16 |
| 35 | 43.0 | 46.5 | −11.6 | +0.24 | −75.2 | +5.52 |
| Corezyn | 43.0 | 47.2 | −27.5 | −1.04 | not (1) measured | not (1) measured |
| OCF E-720 | 43.0 | 47.9 | −20.0 | −0.41 (2) | −65.4 | +3.14 |
| Vestopal 400 | 35.0 | 46.1 | −0.37 | +0.42 | −85.7 | +4.27 |
| DERAKANE ® 411-45 | 45.0 | 42.1 | −13.8 | +0.52 | −100.0 | +9.39 |
| DERAKANE ® | 36.0 | 46.7 | −10.9 | +1.11 | −72.4 | +6.14 |

TABLE VIII-continued

| | Styrene % | Initial Barcol | 5% NaOH Change Barcol (%) | 5% NaOH Change in Weight (%) 30 min. Recovery | Ethanol Change Barcol % | Ethanol Change in Weight (%) 30 min. Recovery |
|---|---|---|---|---|---|---|
| 470-36 | | | | | | |

(1) Sample fractured after 216 hours of exposure.
(2) Dry sample is opaque.

TABLE IX

| | Styrene % | Initial Barcol | Toluene Change Barcol (%) | Toluene Change in Weight % 30 min. Recovery | Toluene Change in Weight % 24 hr. Recovery | Time to Initial Fracture (hr) |
|---|---|---|---|---|---|---|
| Example | | | | | | |
| 28 | 33.0 | 49.0 | — | — | — | 123 |
|  | 43.0 | 46.2 | — | +12.17 | +9.99 | 216 |
| 29 | 33.0 | 49.2 | −35.8 | +4.96 | +4.29 | None |
|  | 43.0 | 46.9 | −68.6 | +10.02 | +8.39 | None |
| 30 | 33.0 | 47.9 | — | — | — | 69.5 |
|  | 43.0 | 45.5 | — | +13.72 | +10.67 | 258.5 |
| 31 | 33.0 | 47.5 | −67.1 | +9.18 | +7.94 | None |
|  | 43.0 | — | — | +11.89 | +9.71 | 216 |
| 32 | 43.0 | 44.7 | — | +11.59 | +9.64 | 258.5 |
| For Comparison | | | | | | |
| 34 | 43.0 | 42.7 | — | — | — | 18.5 |
| 35 | 43.0 | 46.5 | — | — | — | 24 |
| Corezyn | 43.0 | 47.2 | — | — | — | 42.5 |
| OCF E-720 | 43.0 | 47.9 | −66.7 | +4.58 | +3.74 | 258.5 |
| Vestopal 400 | 35.0 | 46.1 | — | — | — | 18.5 |
| DERAKANE ® 411-45 | 45.0 | 42.1 | — | — | — | 26 surface crazing 69.5 fractured |
| DERAKANE ® 470-36 | 36.0 | 46.7 | −10.8 | +0.89 | +0.69 | None |

EXAMPLES 40–49

Modified polyesteramides were prepared from various polyols and piperazine. In each instance, the hydrolysis method with bulk diamine addition was used. The composition of the reactants is shown in Table X. The DCPD concentrate used in Examples 40 and 42 contained 0.52 percent lights, 16.84 percent codimers, 82.60 percent DCPD and 0.04 percent trimers. The DCPD concentrate used in Examples 41, 43–49, and comparative polyester standard C-4 contained 0.31 percent lights, 13.64 percent codimers and 86.05 percent DCPD. In Example 49, the pentaerythritol (0.0585 mole) was added to the reactor after 3.5 hours of the polyesteramidation step had been completed. Whenever 2,5-di-t-butylhydroquinone was used as the inhibitor, it was added to the reactor just prior to the polyesteramidation step.

The resulting polyesteramide alkyds, with the exception of that of Example 45, were formulated to obtain 43 percent styrene-57 percent alkyd solutions. The polyesteramide alkyd of Example 45 was formulated to obtain a 35 percent styrene-65 percent alkyd solution. These solutions were used to determine SPI gel characteristics, room temperature (25° C.) gel characteristics and Brookfield viscosity (25° C.). A cure system of 1.0 percent methyl ethyl ketone peroxide and 0.3 percent cobalt naphthenate (6 percent) was used for the room temperature gel test. Laminates of the polyesteramides, the modified polyester standard and a series of commercially available polyester standards including Corezyn, a general purpose polyester; DERAKANE ®411-45 vinyl ester resin; DERAKANE ®470-36 vinyl ester resin and Dion Corres 6631T, a corrosion resistance polyester, were prepared for tensile and flexural strength testing using the following standard handlayup procedure:

A sheet of 0.005 inch Mylar film is attached to a smooth, flat surface with masking tape. An area of sufficient size is covered with a thin coating of the laminating resin and the surface C-veil (K514-236 treatment) is laid down and smoothed out. Additional resin applied and the first layer of 1.5 ounce chopped fiberglass mat (M113-K247 treatment) is applied. This is carefully rolled down with a serrated aluminum roller to exclude all trapped air. Resin is added followed by a second layer of 1.5 ounce chopped fiberglass mat. Rolling again removes any entrapped air. After adding additional resin, the final surface C-veil is applied and smoothed out. Straight steel rails of ⅛ inch square in cross-section are placed along all four sides of the laminate. A cover sheet of Mylar is rolled onto a 2-inch diameter tube long enough to bridge the rails. Additional resin is added to the laminate and the Mylar is rolled out over it. The Mylar is then stretched tightly and taped down. Any entrapped air or excess resin is squeezed out of the laminate using a wooden tongue depressor. The laminate is left until the polymerization exotherm has subsided and cooling to ambient temperature has occurred. The laminate is removed and postcured at 93° C. (200° F.) for 2.0 hours.

A cure system of 1.0 percent methyl ethyl ketone peroxide and 0.3 percent cobalt naphthenate (6 percent) was used for all of the laminates. All of the DCPD modified unsaturated polyesteramide resins, the DCPD modified unsaturated polyester standard and 43 percent styrenated Corezyn were all retarded with 100 ppm of p-benzoquinone prior to lamination. This was necessary to prevent gelation during the laminate preparation. All of the other resins were used as received.

Comparative Example 4

The DCPD modified unsaturated polyester of Comparative Example 4 was prepared using the hydrolysis method with the reaction stoichiometry specified in Table X.

The physical and mechanical properties of the products of Examples 40–49 and the Comparative Examples were determined as in the previous examples with the results reported in Table XI.

TABLE X

| | MA | IPA | DCPD | H$_2$O | PG | PG/DPG | NPG | Pentaery-thritol | HQ (ppm) | 2,5-di-t-butyl hydroquinone (ppm) |
|---|---|---|---|---|---|---|---|---|---|---|
| Example | | | | | | | | | | |
| 40 | 6.0 | — | 3.6 | 4.2 | 4.212 | — | — | — | 100 | — |
| 41 | 6.0 | — | 3.6 | 4.2 | 4.212 | — | — | — | 100 | — |
| 42 | 6.0 | — | 3.6 | 4.2 | 4.212 | — | — | — | — | 200 |
| 43 | 6.0 | — | 3.6 | 4.2 | 3.798 | — | — | 0.117 | — | 200 |
| 44 | 5.6 | 0.40 | 3.6 | 4.2 | 4.212 | — | — | — | 100 | — |
| 45 | 7.0 | — | 4.2 | 4.9 | 4.914 | — | — | — | 100 | — |
| 46 | 7.0 | — | 4.2 | 4.9 | 4.797 | — | — | 0.0585 | 100 | — |
| 47 | 6.0 | — | 3.6 | 4.2 | — | 2.106/2.106 | — | — | 100 | — |
| 48 | 7.0 | — | 4.2 | 4.9 | — | — | 4.914 | — | 100 | — |
| 49 | 7.0 | — | 4.2 | 4.9 | 4.797 | — | — | 0.0585 | 100 | — |
| For Comparison | | | | | | | | | | |
| C-4 | 7.0 | — | 4.2 | 4.9 | 5.46 | — | — | — | 100 | — |

MA = maleic anhydride
IPA = isophthalic acid
PG = propylene glycol
DPG = dipropylene glycol
NPG = neopentylglycol
HQ = hydroquinone

TABLE XI

| | Acid Number | Reaction time at 205° C. (hr) | Hydrocarbon Reactives Efficiency (%) | Brookfield Viscosity | SPI Gel —84° C. | | | Average Barcol Hardness | Tensile Strength psi × 10$^3$ (Kg/cm$^2$) | Elongation (%) | Flexural Strength psi × 10$^3$ (Kg/cm$^2$) |
| | | | | | Gel Time (min) | Cure Time (min) | Max. Exotherm (min) | | | | |
|---|---|---|---|---|---|---|---|---|---|---|---|
| Example | | | | | | | | | | | |
| 40 | 26.3 | 4.87 | 98.5 | — | 2.15 | 3.6 | 238 | 51.6 | 7.957 (0.5594) | 1.31 | 12.589 (0.8850) |
| 41 | 25.7 | 5.50 | 98.6 | — | — | — | — | 50.4 | 6.979 (0.4906) | 1.36 | 12.030 (0.8457) |
| 42 | 25.6 | 6.07 | 98.6 | .427 | 2.05 | 3.25 | 223 | 50.5 | 7.712 (0.5422) | 1.42 | 12.530 (0.8809) |
| 43 | 30.2 | 7.08 | 93.2 | 1.805 | — | — | — | 49.5 | 9.173 (0.6449) | 1.53 | 9.170 (0.6447) |
| 44 | 29.9 | 6.67 | 97.9 | .286 | — | — | — | 50.0 | 7.681 (0.5340) | 1.33 | 11.269 (0.7922) |
| 45 | 24.8 | 5.33 | 98.7 | 1.057 | — | — | — | 51.6 | 6.691 (0.4704) | 1.16 | 8.317 (0.5847) |
| 46 | 26.7 | 6.50 | 95.4 | .236 | 2.2 | 3.5 | 237 | 51.6 | 6.521 (0.4584) | 1.51 | 10.404 (10.404) |
| 47 | 26.7 | 5.75 | 95.9 | .097 | 3.35 | 4.6 | 208 | 50.8 | 7.333 (0.5155) | 0.99 | 12.349 (0.8681) |
| 48 | 20.3 | 6.25 | 98.4 | .160 | 3.4 | 4.9 | 222 | 52.4 | 6.997 (0.4919) | 1.10 | 9.441 (0.6637) |
| 49 | 26.1 | 6.50 | 98.9 | .545 | 2.15 | 3.35 | 238 | 49.6 | 7.094 (0.4987) | 1.47 | 10.723 (0.7538) |
| For Comparison | | | | | | | | | | | |
| C-4 | 24.8 | 5.50 | 97.5 | 0.55 | — | — | — | 52.7 | 7.198 (506.02) | 1.38 | 11.121 (0.7818) |
| Corezyn | — | — | — | .125 | — | — | — | 49.0 | 10.921 (767.75) | 1.20 | 9.865 (0.6935) |
| DERAKANE ® 411-45 | — | — | — | .470 | — | — | — | 44.7 | 13.221 (929.44) | 1.75 | 16.134 (1.1342) |
| DERAKANE ® 470-36 | — | — | — | .283 | — | — | — | 51.6 | 8.932 (627.92) | 1.02 | 10.756 (0.7561) |
| Dion Corres 6631T | — | — | — | .268 | 4.75 | 6.75 | 225 | 49.5 | 8.833 (620.96) | 1.08 | 12.606 (0.8862) |

The room temperature (25° C.) gel test gave the following results:

| | Gel Time (min) | Cure Time (min) | Max. Exotherm °C. |
|---|---|---|---|
| Example | | | |
| 40 | 8.0 | 25 | 108 |
| 42 | 3.0 | 15 | 102 |
| 49 | 6.0 | 28 | 105 |
| For Comparison | | | |
| Dion Corres 6631T | 15.0 | 33.0 | 59.5 |

EXAMPLE 50

A modified polyesteramide was prepared using the prehydrolysis method described in Example 32 and the following reaction stoichiometry:

| | |
|---|---|
| DCPD concentrate | 3.6 moles |
| MA | 6.0 moles |
| $H_2O$ | 6.375 moles |
| PG | 4.212 moles |
| piperazine | 0.468 mole |

The DCPD concentrated contained 0.52 percent lights, 16.84 percent codimers, 82.60 percent DCPD and 0.04 percent trimers. Hydroquinone (100 ppm) was used as the inhibitor. The resulting polyesteramide alkyd was formulated, laminated and tested for mechanical properties using the methods of Examples 40–49. The following results were obtained:

| | |
|---|---|
| Acid number | 26.1 |
| Reaction time at 205° C. (hr) | 5.08 |
| Hydrocarbon Reactives Efficiency (%) | 97.0 |
| Brookfield Viscosity | .186 |
| SPI Gel-84° C. | |
| gel time (min.) | 2.38 |
| cure time (min.) | 3.6 |
| max. exotherm (°C.) | 230 |
| Room Temp. Gel-25° C. | |
| gel time (min.) | 11.0 |
| cure time (min.) | 23.0 |
| max. exotherm (°C.) | 97 |
| Ave. Barcol Hardness | 51.6 |
| Tensile Strength × $10^3$ psi (Kg/$cm^2$) | 7.574 (532.5) |
| Elongation (%) | 1.22 |
| Flexural Strength × $10^3$ psi (Kg/$cm^2$) | 10.458 (0.7352) |

EXAMPLE 51

A modified polyesteramide was prepared using the hydrolysis method with bulk diamine addition, and the same reaction stoichiometry as was used in Example 45. A laminate was prepared using the method of Examples 40-49 except that no postcure was employed and no p-benzoquinone was used. The development of Barcol hardness at 25° C. was determined using a 934-1 Barcol Impressor. The following results were obtained:

| | Average Barcol Hardness |
|---|---|
| Time (hrs) | |
| 0 | gelation |
| 4 | 1.1 |
| 5 | 5.1 |
| 6 | 7.6 |
| 24 | 28.7 |
| 48 | 37.7 |
| 72 | 41.7 |
| 96 | 43.9 |
| SPI Gel-84° C. | |
| gel time (min.) | 2.7 |
| cure time (min.) | 3.8 |
| max. exotherm (°C.) | 227 |
| Room Temp. Gel-25° C. | |
| gel time (min.) | 7 |
| cure time (min.) | 25 |
| max. exotherm (°C.) | 96 |

EXAMPLE 52

A series of clear, unfilled castings measuring 2×2×0.165 inches thick were cured using 1.0 percent benzoyl peroxide and 0.01 percent diemethylaniline followed by 2.0 hours of postcuring at 93° C. (200° F.). The dielectric constant and dissipation factor for each resin was determined using a General Radio Co., Type 1610 Capacitance Measuring Assembly set at a frequency of 1000 cycles per second. All measurements were made at room temperature (25° C.). The following results were obtained:

| Resin | Dissipation Factor (× $10^{-3}$) | Dielectric Constant |
|---|---|---|
| DERAKANE ® 470-36 vinyl ester resin | 5.57 | 3.57 |
| DERAKANE ® 411-45 vinyl ester resin | 2.82 | 3.30 |
| Corezyn (43% styrene) | 5.78 | 3.30 |
| Owens Corning Fiberglass E-720 (43% styrene) | 4.00 | 3.03 |
| DCPD modified polyesteramide of Example 31 | 3.45 | 3.03 |
| DCPD modified polyesteramide of Example 32 | 3.55 | 2.96 |
| DCPD modified polyester standard of Example 35 | 4.55 | 2.94 |

EXAMPLE 53

A series of laminates were prepared using the methods of Examples 40–49. The DCPD modified unsaturated polyesteramide was prepared using the hydrolysis method with bulk diamine addition and the same reaction stoichiometry as was used in Example 45. A final acid number of 25.8 was attained after 5.5 hours of polyesteramidation at 205° C. The hydrocarbon reactives efficiency was 97.5 percent. The Brookfield viscosity of the 57 percent alkyd-43 percent styrene solution was 0.163 Pascal second. A 2.35 minute gel time, 3.45 minute cure time and 225° C. maximum exotherm were obtained in the SPI gel test. The commercially available polyester standards used to prepare laminates included DERAKANE®411-45 vinyl ester resin, DERAKANE®470-36 vinyl ester resin and Dion Corres 6631T, a corrosion resistant polyester resin. Samples for tensile and flexural strength testing and measurement of heat distortion temperature, were prepared from each respective laminate. The samples were placed into a forced air oven maintained at 210° C. for the time intervals indicated in Table XII. The results are reported in Table XII.

TABLE XII

| Resin | Hours at 210° C. | Average Barcol Hardness | Heat Distortion Temp. (°C.) | Tensile Strength psi × 10³ (Kg/cm²) | Elongation (%) | Flexural Strength psi × 10³ (Kg/cm²) | Flexural Modulus psi × 10⁵ (Kg/cm²) |
|---|---|---|---|---|---|---|---|
| DERAKANE ® 411-45 | 0 | 44.2 | 113.6 | 14.011 (984.8) | 1.83 | 15.878 (1.1162) | 8.22 (0.58) |
| | 96* | 46.7 | 121.9 | 8.530 (599.6) | 1.12 | 10.723 (0.7538) | 7.82 (0.55) |
| | 240* | 50.0 | 123.0 | 7.621 (535.7) | 0.92 | 10.065 (0.7076) | 7.56 (0.53) |
| | 408* | 49.9 | 107.2 | 7.243 (509.1) | 1.03 | 9.576 (0.6732) | 6.70 (0.47) |
| | 576* | 49.2 | 107.2 | 6.770 (475.9) | 0.99 | 9.882 (0.6947) | 7.57 (0.53) |
| DERAKANE ® 470-36 | 0 | 52.6 | 120.3 | 8.659 (608.7) | 1.09 | 11.126 (0.7822) | 8.47 (0.59) |
| | 96 | 52.2 | 157.2 | 8.000 (562.4) | 1.00 | 9.941 (0.6989) | 8.02 (0.56) |
| | 240 | 54.2 | 179.5 | 7.446 (523.4) | 1.04 | 8.919 (0.6270) | 8.06 (0.57) |
| | 408 | 50.3 | 179.5 | 7.273 (511.2) | 1.28 | 8.696 (0.6113) | 7.68 (0.54) |
| | 576 | 52.2 | 157.2 | 6.593 (463.49) | 1.15 | 8.867 (0.6234) | 7.28 (0.51) |
| Dion Corres 6631T | 0 | 48.3 | 116.2 | 8.969 (630.5) | 1.11 | 12.546 (0.8820) | 9.11 (0.64) |
| | 96* | 49.0 | 125.3 | 7.315 (514.2) | 0.94 | 10.646 (0.7484) | 7.90 (0.55) |
| | 240* | 51.1 | 119.7 | 8.003 (562.6) | 0.97 | 10.097 (0.7098) | 7.26 (0.51) |
| | 408* | 51.5 | 96.7 | 8.065 (566.9) | 1.18 | 10.540 (0.7410) | 6.56 (0.46) |
| | 576* | 50.5 | 93.3 | 6.810 (478.74) | 0.90 | 10.272 (0.7221) | 6.12 (0.43) |
| DCPD Modified Unsaturated Polyester-amide | 0 | 50.7 | 125.3 | 7.623 (535.9) | 1.40 | 12.720 (0.8942) | 7.75 (0.54) |
| | 96 | 51.4 | 183.6 | 6.708 (471.5) | 1.41 | 12.275 (0.8629) | 7.63 (0.53) |
| | 240 | 51.5 | 186.4 | 7.358 (517.2) | 1.70 | 12.552 (0.8824) | 6.92 (0.49) |
| | 408 | 49.7 | 183.3 | 6.845 (481.2) | 1.95 | 12.318 (0.8660) | 5.47 (0.38) |
| | 576 | 50.1 | >187.8 | 6.717 (472.2) | 1.75 | 11.989 (0.8428) | 5.30 (0.37) |

*Partial delamination of each sample has occurred.

EXAMPLE 54

Shrinkage upon curing of a clear, unfilled casting of approximately 25 cm in length was measured. A room temperature cure of 1.0 percent methyl ethyl ketone peroxide and 0.1 percent cobalt naphthenate (6 percent) was used to cure the 43.0 percent styrenated resin solutions as designated by the appropriate example number. The length of each cured casting was measured after the polymerization exotherm had subsided and ambient temperature (25° C.) was reached, and was used to calculate the following percent shinkage upon curing values:

| Resin of | Shrinkage upon Curing (%) |
|---|---|
| Example 1 | 1.13 |
| Example 2 | 1.11 |
| Example 3 | 0.75 |
| Example 7 | 1.12 |
| Example 11 | 1.12 |
| Example 13 | 0.93 |
| Example 24 | 1.30 |
| Example 25 | 1.68 |
| Example 26 | 1.50 |
| Comparative Example C-1 | 2.79 |

EXAMPLE 55

A modified polyesteramide was prepared using the hydrolysis method with bulk diamine addition, and the following reaction stoichiometry:

| | |
|---|---|
| DCPD concentrate | 1.2 moles |
| MA | 2.0 moles |
| H₂O | 1.7 moles |
| PG | 1.704 moles |
| homopiperazine | 0.156 mole |

The DCPD concentrate contained 0.31 percent lights, 13.67 percent codimers and 86.05 percent DCPD. The resulting polyesteramide alkyd was formulated and tested for mechanical properties using the methods of Example 36. The following results were obtained:

| | |
|---|---|
| Acid number | 35.6 |
| Reaction time at 205° C. (hr) | 3.50 |
| Hydrocarbon Reactives | 96.5 |
| Efficiency (%) | 96.5 |
| Brookfield Viscosity | 190 |
| SPI Gel-84° C. | |
| gel time (min.) | 1.09 |
| cure time (min.) | 1.75 |
| max. exotherm (°C.) | 229.5 |
| Ave. Barcol Hardness | 46.0 |

| | |
|---|---|
| Tensile Strength × 10³ psi | 2.317 |
| (Kg/cm²) | (.163) |
| Elongation (%) | 0.53 |
| Flexural Strength × 10³ psi | 12.156 |
| (Kg/cm²) | (0.8546) |

EXAMPLE 56

Maleic anhydride (686.42 g) was added to a reactor and maintained at 120° C. under a nitrogen atmosphere as a clear, stirred solution. Water (135.15 g) was added and induced a maximum exotherm of 146° C. 1 minute later. Fifteen minutes after the initial water addition, a 123° C. temperature was established and dicyclopentadiene concentrate (278.70 g) was added. The dicyclopentadiene concentrate contained 0.38 percent lights, 13.91 percent codimers and 85.72 percent DCPD. A maximum exotherm of 135° C. resulted 2 minutes later and was controlled by air-cooling of the reactor. Fifteen minutes later, a second aliquot of dicyclopentadiene concentrate (278.70 g) was added to the reactor. Fifteen minutes later, a final aliquot of dicyclopentadiene concentrate (278.70 g) was added. The reaction temperature was held at 120° C. for 30 minutes then propylene glycol (287.66 g) and piperazine (36.18 g) were added to the reactor and the steam condenser was started, nitrogen sparging was increased to 4 lpm, and the temperature controller was set at 160° C. The 160° C. temperature was reached 26 minutes later. After 2 hours at the 160° C. temperature, the temperature controller was set at 205° C. and this temperature was achieved 30 minutes later. After 9.5 hours, a total of 132 milliliters of water layer and 56 milliliters of organic material were collected in the Dean Stark trap. The reactor was cooled to 168° C. and 100 ppm of hydroquinone was added. The polyesteramide alkyd was recovered as a clear, light yellow solid with a final acid number of 31.3.

The resulting polyesteramide alkyd was formulated to provide a 57.0 percent alkyd—43.0 percent styrene solution. This solution was used to prepare a laminate and tested for mechanical properties using the methods of Examples 40-49. The following results were obtained:

| | |
|---|---|
| Brookfield Viscosity | 0.160 |
| Ave. Barcol Hardness | 47.5 |
| Tensile Strength × 10³ psi | 8.474 |
| (Kg/cm²) | (0.5957) |
| Elongation (%) | 1.56 |
| Flexural Strength × 10³ psi | 13.236 |
| (Kg/cm²) | (0.9305) |
| Flexural Modulus × 10⁻⁵ psi | 8.27 |
| (Kg/cm²) | (0.5814) |

What is claimed is:

1. A norbornyl modified polyesteramide composed of:
    (A) a central esteramide chain consisting essentially of:
        (a) diamino groups of the formula:

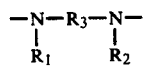

wherein
$R_1$ and $R_2$ are independently selected from the group consisting of hydrogen, aliphatic, cycloaliphatic and aromatic or $R_1$ and $R_2$ together form an aliphatic ring, and $R_3$ is a divalent organic radical selected from the group consisting of alkylene, ether-linked alkylene, ether-linked arylene, alkylene amino-linked alkylene, alkylene amino-linked cycloalkylene, cycloalkylene, polycycloalkylene, arylene, alkylarylene bis(alkyl)cycloalkylene and bis(alkyl)polycycloalkylene,
    (b) bisalkoxy groups of the formula:

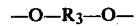

wherein
$R_3$ is a divalent organic radical as before defined,
    (c) carboxylic acid groups at least a part of which are $\alpha,\beta$-unsaturated carboxylic groups with any remainder being saturated aliphatic carboxylic groups, aromatic carboxylic groups or mixtures thereof,
    (B) at least one terminal group of said polyesteramide being a norbornyl radical.

2. The modified polyesteramide of claim 1 wherein said diamino groups are from an aliphatic diamine.
3. The modified polyesteramide of claim 2 wherein said diamine is ethylene diamine.
4. The modified polyesteramide of claim 2 wherein said diamine is 1,6-hexanediamine.
5. The modified polyesteramide of claim 1 wherein said amino groups are from a cycloaliphatic diamine.
6. The modified polyesteramide of claim 5 wherein said diamine is piperazine.
7. The modified polyesteramide of claim 5 wherein said diamine is homopiperazine.
8. The modified polyesteramide of claim 5 wherein said diamine is 4,4'-methylenebis(cyclohexylamine).
9. The modified polyesteramide of claim 5 wherein said diamine is 2,2'-bis(4-aminocyclohexyl)propane.
10. The modified polyesteramide of claim 1 wherein said amino groups are from a polycycloaliphatic diamine.
11. The modified polyesteramide of claim 10 wherein said diamine is bis(aminomethyl)dicyclopentadiene.
12. The modified polyesteramide of claim 10 wherein said diamine is bis(aminomethyl)norborane.
13. The modified polyesteramide of claim 1 wherein said amino groups are from an aromatic diamine.
14. The modified polyesteramide of claim 13 wherein said diamine is 4,4'-diaminodiphenylether.
15. The modified polyesteramide of claim 1 wherein said amino groups are from an ether linked alkylene diamine.
16. The modified polyesteramide of claim 15 wherein said diamine is bis(2-aminomethyl)ether.
17. The modified polyesteramide of claim 1 wherein said amino groups are from a polyamine.
18. The modified polyesteramide of claim 17 wherein said polyamine is diethylenetriamine.
19. The modified polyesteramide of claim 17 wherein said polyamine is aminoethylpiperazine.
20. The modified polyesteramide of claim 1 wherein said bisoxo group is from an aliphatic glycol or mixture of aliphatic glycols.
21. The modified polyesteramide of claim 20 wherein said bisoxo group is from propylene glycol.
22. The modified polyesteramide of claim 20 wherein said bisoxo group is from neopentyl glycol.

23. The modified polyesteramide of claim 20 wherein said bisoxo group is from a mixture of propylene glycol and dipropylene glycol.

24. The modified polyesteramide of claim 20 wherein said bisoxo group is from a mixture of propylene glycol and diethylene glycol.

25. The modified polyesteramide of claim 1 wherein said bisoxo group is from a polycycloaliphatic glycol.

26. The modified polyesteramide of claim 25 wherein said bisoxo group is from dicyclopentadiene dimethanol.

27. The modified polyesteramide of claim 1 wherein said bisoxo group is from bis(hydroxypropyl)bisphenol A.

28. The modified polyesteramide of claim 1 wherein said bisoxo groups are from a mixture of an aliphatic glycol and aliphatic polyol.

29. The modified polyesteramide of claim 28 wherein said bisoxo groups are from a mixture of propylene glycol and pentaerythritol.

30. The modified polyesteramide of claim 1 wherein said norbornyl radical is from dicyclopentadiene.

31. The modified polyesteramide of claim 1 wherein said norbornyl radical is from a dicyclopentadiene concentrate containing Diels-Alder dimers of diolefins.

32. The modified polyesteramide of claim 1 wherein said norbornyl radical is from polycyclopentadiene.

33. The modified polyesteramide of claim 1 wherein said norbornyl radical is from norbornene.

34. The modified polyesteramide of claim 1 wherein said $\alpha,\beta$-unsaturated dicarboxylic acid group is maleoyl.

35. The modified polyesteramide of claim 1 wherein said $\alpha,\beta$-unsaturated dicarboxylic acid groups are a mixture of maleoyl and phthaloyl groups.

36. The modified polyesteramide of claim 1 wherein said $\alpha,\beta$-unsaturated dicarboxylic acid groups are maleoyl and isophthaloyl.

37. The modified polyesteramide of claim 1 wherein said $\alpha,\beta$-unsaturated dicarboxylic acid group is fumaroyl.

38. The modified polyesteramide of claim 1 containing hydroquinone inhibitor.

39. The modified polyesteramide of claim 1 containing 2,5-di-t-butyl hydroquinone inhibitor.

40. A formulation of the modified polyesteramide of claim 1 and an unsaturated monomer.

41. A formulation of claim 40 wherein said monomer is styrene.

42. A cured composition of the formulation of claim 40.

43. A formulation of claim 42 containing a reinforcing agent.

44. A process for making modified unsaturated polyesteramides wherein a mixture of norbornene or a norbornene derivative is reacted with an $\alpha,\beta$-unsaturated polycarboxylic acid, anhydride, or mixture thereof, a diamine, or polyamine, and a glycol, or a glycol-polyol mixture.

45. The process of claim 44 wherein water is additionally included as a reactant.

46. The process of claim 44 or 45 wherein a saturated or aromatic polycarboxylic acid, anhydride or mixture thereof replaces a part of the $\alpha,\beta$-unsaturated acid, anhydride or mixture thereof.

47. The process of claim 44 wherein said norbornene derivative is dicyclopentadiene monoalcohol.

48. The process of claim 45 wherein:

(a) an $\alpha,\beta$-unsaturated dicarboxylic acid anhydride and a fraction of the stoichiometric equivalent of water are heated to a temperature of from about 60° to 130° C.;

(b) an initial fractional equivalent of said norbornene or norbornene derivative is added and allowed to react;

(c) one or more additional fractional equivalent of water and norbornene or norbornene derivative is added and allowed to react;

(d) additional fractional equivalents of norbornene or norbornene derivative are added and each allowed to react before subsequent addition of the next increment until the desired amount of norbornene or norbornene derivative has been added;

(e) the diamine, or polyamine plus the glycol, or polyol or mixture thereof, are added and the temperature maintained from about 110° to 205° C. with continual removal of water.

49. The process of claim 45 wherein:

(a) an $\alpha,\beta$-unsaturated dicarboxylic acid anhyride and at least a stoichiometric equivalent of water are heated to a temperature of from about 120° to 125° C.;

(b) an initial equivalent of norbornene or norbornene derivative is added and allowed to react;

(c) additional fractional equivalents of norbornene or norbornene derivative are added and each allowed to react before subsequent addition of the next increment until the desired amount of norbornene or norbornene derivative has been added;

(d) the diamine, or polyamine plus the glycol, or polyol or mixture thereof are added and the temperature maintained from about 110° to 205° C. with continual removal of water.

50. The process of claim 48 or 49 wherein all of the diamine, or polyamine and the glycol, or polyol or mixture thereof, are added in one step.

51. The process of claim 48 or 49 wherein all of the glycol or polyol or mixture thereof and a fractional equivalent of the diamine, or polyamine are added initially and allowed to react after which subsequent increments of the diamine, or polyamine are added.

52. The process of claim 48 or 49 wherein a polyol containing 3 or more hydroxyl groups is separately added after polyesteramidation is substantially complete.

53. The process of claim 44 or 45 wherein 2,5-di-t-butylhydroquinone is added to the reaction as a process inhibitor.

54. The process of claim 44 or 45 wherein said diamine is an aliphatic diamine.

55. The process of claim 44 or 45 wherein said diamine is a cycloaliphatic diamine.

56. The process of claim 44 or 45 wherein said diamine is a polycycloaliphatic diamine.

57. The process of claim 44 or 45 wherein said diamine is an aromatic diamine.

58. The process of claim 44 or 45 wherein said diamine is an ether linked alkylene diamine.

59. The process of claim 44 or 45 wherein said amino groups are from a polyamine.

60. The process of claim 44 or 45 wherein said glycol is an aliphatic glycol or mixture of aliphatic glycols.

61. The process of claim 44 or 45 wherein said glycol is a polycycloaliphatic glycol.

62. The process of claim 44 or 45 wherein said hydroxyl groups are from a glycol-polyol mixture.

63. The process of claim 44 or 45 wherein said norbornene derivative is from dicyclopentadiene.

64. The process of claim 44 or 45 wherein said norbornene derivative is from polycyclopentadiene.

65. The process of claim 44 or 45 wherein said norbornene derivative is from norbornene.

66. The process of claim 44 or 45 wherein said norbornene derivative is from a dicyclopentadiene concentrate containing Diels-Alder dimer of diolefin.

67. The process of claim 44 or 45 wherein said $\alpha,\beta$-unsaturated dicarboxylic acid group is maleoyl.

68. The process of claim 44 or 45 wherein said $\alpha,\beta$-unsaturated dicarboxylic acid is maleoyl and phthaloyl.

69. The process of claim 44 or 45 wherein said $\alpha,\beta$-unsaturated dicarboxylic acid is maleoyl and isophthaloyl.

70. The process of claim 44 or 45 wherein said $\alpha,\beta$-unsaturated dicarboxylic acid is fumaroyl.

* * * * *